(12) United States Patent
Golner et al.

(10) Patent No.: US 7,343,274 B2
(45) Date of Patent: Mar. 11, 2008

(54) SENSOR AND METHOD FOR DETECTING ELECTRIC CONTACT DEGRADATION

(75) Inventors: Thomas M. Golner, Pewaukee, WI (US); Shirish P. Mehta, Waukesha, WI (US); Jeffrey J. Nemec, Oconomowoc, WI (US)

(73) Assignee: Waukesha Electric Systems, Inc., Waukesha, WI (US)

( * ) Notice: Subject to any disclaimer, the term of this patent is extended or adjusted under 35 U.S.C. 154(b) by 301 days.

(21) Appl. No.: 11/157,982

(22) Filed: Jun. 22, 2005

(65) Prior Publication Data

US 2006/0292710 A1 Dec. 28, 2006

(51) Int. Cl.
*G06F 17/50* (2006.01)
*G11B 9/00* (2006.01)
(52) U.S. Cl. .................... 703/9; 703/11; 423/447.1; 977/750
(58) Field of Classification Search ............... 703/1, 703/5, 9, 11; 423/445–447, 447.1, 447.2; 429/12; 977/750
See application file for complete search history.

(56) References Cited

U.S. PATENT DOCUMENTS

| | | | |
|---|---|---|---|
| 6,496,020 B1* | 12/2002 | Davey et al. | 324/674 |
| 6,939,525 B2* | 9/2005 | Colbert et al. | 423/447.1 |
| 6,960,290 B2* | 11/2005 | Akhavan et al. | 205/783 |
| 2002/0102201 A1* | 8/2002 | Colbert et al. | 423/445 R |
| 2005/0064251 A1* | 3/2005 | Li et al. | 429/12 |

* cited by examiner

*Primary Examiner*—Thai Phan
(74) *Attorney, Agent, or Firm*—Baker & Hostetler LLP

(57) ABSTRACT

A probe cell monitors conditions within electrical power transmission and switchgear apparatus to detect degradation of stressed components. The probe cell is a hardware simulation of components of a specific unit of electrical power apparatus, including electrodes between which an electric field gradient is established. The probe cell electrodes accumulate contamination at a rate related to accumulation rate on components of working apparatus. In a typical embodiment, a probe cell installed within an enclosure shares the insulating, hydrocarbon-based immersion fluid of the apparatus. Because the probe cell can be invasively tested and results recorded as often as desired without deenergizing the actual apparatus, degradation of the apparatus can be predicted with high confidence, avoiding unnecessary maintenance as well as unexpected catastrophic failure. Potential reduction in unproductive preventive maintenance while avoiding emergency repairs can offset probe cell cost.

22 Claims, 3 Drawing Sheets

SENSOR AND METHOD FOR DETECTING ELECTRIC CONTACT DEGRADATION

FIELD OF THE INVENTION

The present invention relates generally to switchgear associated with electric power infrastructure distribution transformers. More particularly, the present invention relates to apparatus and methods for timely, non-invasive detection of degradation of electrical contacts and fill fluids used in load tap changers, relays, and other oil-immersed switchgear components.

BACKGROUND OF THE INVENTION

Very large electrical power infrastructure distribution transformers, such as those used in facilities known as substations, use three-phase power at substantial voltages and currents, typically lowering the voltage drawn from long distance transmission lines and providing power to large customers—factories, apartment buildings, housing developments, and the like—which are in turn located in the vicinity of the substations. Comparable transformers are used at power plants and other facilities to step up voltage to levels suitable for application to long distance transmission lines.

Load current variations in power distribution systems affect voltage drops across both customer load impedances and distribution system elements. These voltage changes require compensating adjustments in transformer winding connections ("taps") to maintain the available voltage at the loads within prescribed limits, with the intent of maintaining as close to a constant voltage as practicable at each distributed load. It is known in power distribution apparatus to include, with the requisite multi-tap power transformers, automatically controlled load tap changers (LTCs) that can adjust the voltage at which power is fed to large loads, typically several times per day but as often as hundreds of times per day. The tap changes are made without interrupting the load current in some embodiments, hence the term "load tap changer".

Despite typical use of make-before-break switching, voltage and current transients can cause arcing (voltage transients sufficient to cause gas bubbles and ionization in a liquid fill fluid) and local heating events, particularly at the LTC contacts. These events can promote changes in the refined petroleum distillates (mineral oils) commonly used in such applications, including fragmentation that releases volatiles (short-chain hydrocarbon gases), oxidation that forms acids and insoluble particulates, and a variety of other processes yielding mixed products that are preferably but imperfectly filtered and vented out of the LTCs.

In high current contact applications such as load tap changers, circuit breakers, unloaded (de-energized switching) tap changers, and other bolted, sliding, and pressure-impelled connections, it is desirable in view of safety, damage, and overall cost considerations that the physical condition of the contact hardware and fill fluid be monitored effectively continuously. Such monitoring can potentially maximize overall power distribution system reliability.

Electrical contacts in oil (or another insulating fluid) are susceptible to film formation, which can lead to increased contact resistance. Over time, the higher contact resistance increases voltage drop and thus contact temperature, with the possibility of the formation of "coke" (a hard carbonaceous material with poor conductivity that also acts as a thermal insulator). The positive feedback cycle of more heat forming a thicker coke layer can increase local temperatures abruptly and severely. This runaway temperature increase can in turn lead to abrupt failure of a contact system.

Film buildup is accelerated by the presence of contaminants and other undesirable chemicals in the fluid. Electrical stress in the area of the electrical contact is thought to contribute directly to the formation of impurities. In order to reduce the potential impact of film formation and coking, it would be helpful to be able to predict contact degradation early, so that corrective action could be taken before the contact system is irreversibly damaged.

In the known prior art, detection is limited to measurement of contact resistance, analysis of vented and dissolved gases, temperature difference between oil in the LTC and oil in the associated transformer, and visual inspection. Problems potentially detectable by measurements of contact resistance may be masked by the existence of alternative conduction paths and of resistance in other parts of a system. Systems typically must be deenergized for resistance tests. Gas analysis and observation of temperature differential measure only the consequences of contact heating, not the condition of the contacts themselves. Conditions within an LTC or other power switchgear device not related to contact degradation can produce false positive readings. Such test defects can lead to costly and unnecessary maintenance, leading in turn to administrative distrust of testing processes and less-than-effective test application. Also, such tests do not constitute continuous monitoring.

Visual inspection requires that a system with a suspect LTC or other switchgear device be de-energized, then in many cases drained of oil and disassembled. The constituent parts must then be visually examined (sometimes microscopically). Such evaluation is therefore typically performed only when opportunity—and extrinsic evidence—justify the effort and the inevitable loss of continuous service to a load.

Accordingly, it is desirable to provide an apparatus and method that allow timely, accurate, non-invasive detection of degradation of contact condition in power switchgear.

SUMMARY OF THE INVENTION

The foregoing needs are met, to a great extent, by the present invention, wherein in one aspect an apparatus is provided that in some embodiments provides a test probe assembly for a switchgear device wherein stresses applied to rapid wearout components of the working switchgear are accurately duplicated, wherein the test probe assembly develops degradation of at least one of its components at a rate strongly correlated to the degradation rate within the working switchgear, and wherein the test probe assembly allows frequent testing without interruption of operation of the working switchgear.

In accordance with one embodiment of the present invention, a probe cell for simulating electrical component degradation in switchgear is presented. The probe cell includes a probe core containing a first probe cell electrode having a conductive surface, a probe shell containing a second probe cell electrode, displaced from the probe core, a power source, wherein the power source establishes a probe interelectrode voltage field, wherein the probe interelectrode voltage field corresponds substantially to an operational condition of components subject to degradation, and a probe cell measurement group configured to detect at least one property of the probe cell.

In accordance with another embodiment of the present invention, a probe cell for simulating electrical component degradation in switchgear is presented. The probe cell includes means for simulating a switchgear component with a simulation material, means for establishing a voltage gradient proximal to the means for simulating a switchgear component, wherein the voltage gradient corresponds substantially to an operational condition of a switchgear component subject to degradation, means for applying electrical power to the means for establishing a voltage gradient, and means for measuring an electrical property of the means for simulating a switchgear component.

In accordance with yet another embodiment of the present invention, a method for simulating electrical component degradation in switchgear is presented. The method includes simulating a switchgear electrode with a first simulation material, establishing an interelectrode field with a second simulation material, spacing the first and second simulation materials to support establishment of an interelectrode field gradient therebetween, providing a source for application of electrical power to the interelectrode field, wherein the interelectrode field gradient established thereby corresponds substantially to an operational condition of components subject to degradation, and providing a degradation response measurement capability in the simulated switchgear.

In accordance with still another embodiment of the present invention, a method for managing electrical component deterioration in switchgear is presented. The method includes simulating switchgear apparatus, wherein a probe cell, having at least two electrodes of substantially known spacing, provides simulation of dimensional, material, and electrical aspects of switchgear components, promoting deterioration of probe cell electrodes by applying differential voltage therebetween, wherein the differential voltage corresponds substantially to an operational condition of switchgear components subject to deterioration, providing test apparatus to measure probe cell electrical properties, establishing probe cell fault values, wherein probe cell electrical properties correspond to deterioration-dependent switchgear failure risks, and reporting an extent of need for service of switchgear as a function of probe cell fault values.

There have thus been outlined, rather broadly, certain embodiments of the invention in order that the detailed description thereof herein may be better understood, and in order that the present contribution to the art may be better appreciated. There are, of course, additional embodiments of the invention that will be described below and which will form the subject matter of the claims appended hereto.

In this respect, before explaining at least one embodiment of the invention in detail, it is to be understood that the invention is not limited in its application to the details of construction and to the arrangements of the components set forth in the following description or illustrated in the drawings. The invention is capable of embodiments in addition to those described and of being practiced and carried out in various ways. Also, it is to be understood that the phraseology and terminology employed herein, as well as the abstract, are for the purpose of description and should not be regarded as limiting.

As such, those skilled in the art will appreciate that the conception upon which this disclosure is based may readily be utilized as a basis for the designing of other structures, methods, and systems for carrying out the several purposes of the present invention. It is important, therefore, that the claims be regarded as including such equivalent constructions insofar as they do not depart from the spirit and scope of the present invention.

DETAILED DESCRIPTION

Figure 1:
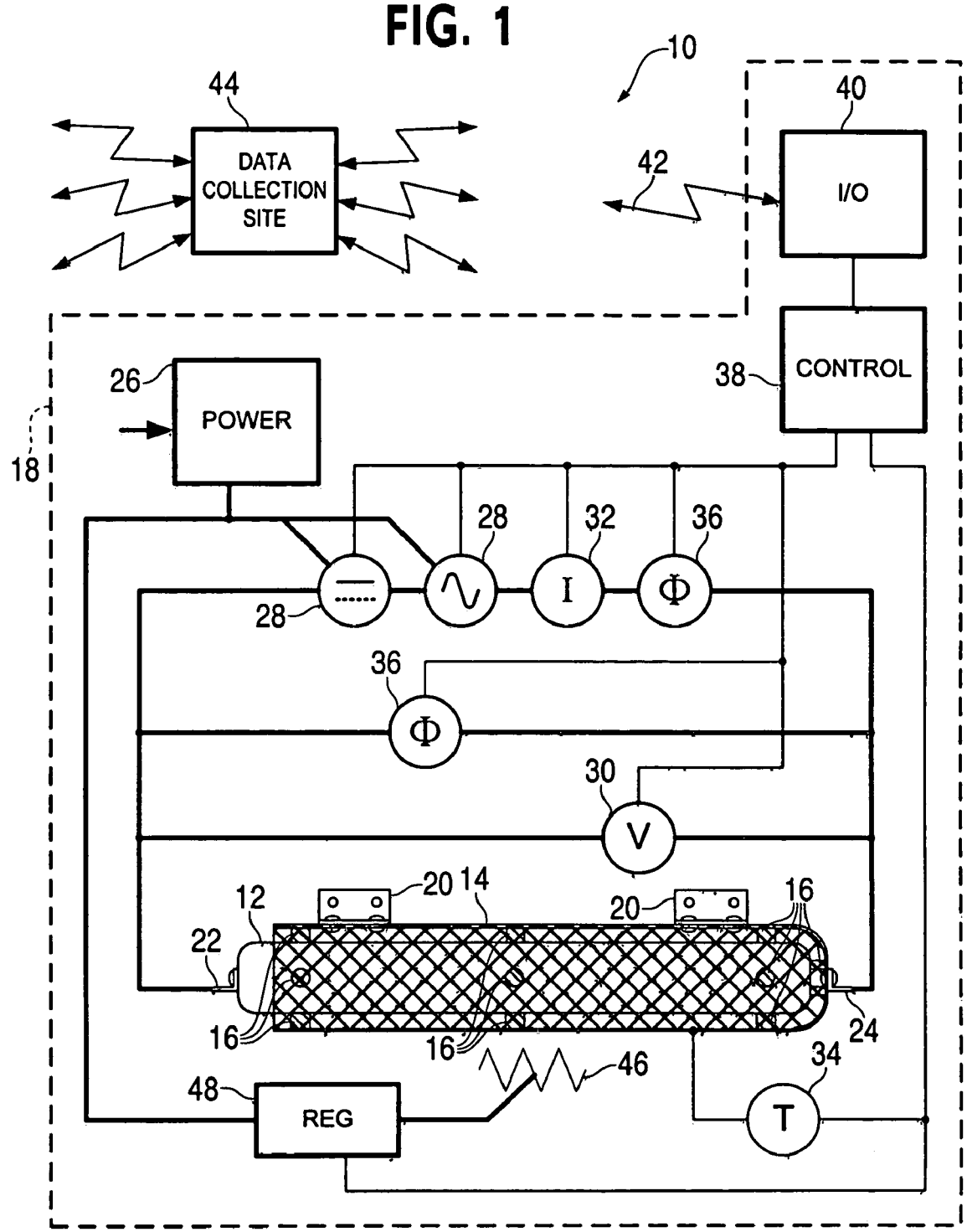
FIG. 1 is a schematic view of a probe system for monitoring degradation of switchgear contacts.

The invention will now be described with reference to the drawing figures, in which like reference numerals refer to like parts throughout. An embodiment in accordance with the present invention provides an electrode surrounded by a porous shell, the assembly immersed in switchgear fill fluid, excited by a voltage supply, and monitored by one or more electrical test devices. Test results are provided at a preferred rate to a data recordation and analysis facility. Test results suggestive of rapid degeneration can trigger automated or manual intervention, such as scheduling service visits and overhaul operations for the switchgear showing the loss of efficiency.

Switchgear contacts operating in dielectric fluids (either gas or liquid) characteristically tend to develop film coatings based on conditions such as electrical field, contact material, type of dielectric fluid, contact current, and temperature. With knowledge of the materials of construction and the electrical fields involved, a probe cell is developed that simulates immersed contacts, and, by monitoring the condition of the probe cell, that allows prediction of the rate of degeneration of the working contacts.

A probe cell can be designed in some embodiments as an effectively continuous, on-line condition monitor. The probe cell can be equipped for remote monitoring, and can be used to initiate scheduling of maintenance on an as-needed basis. The probe cell is a more direct sensor of contact condition than the methods presently used.

A probe cell can be designed that includes in its construction one or more film formation-susceptible materials within a switchgear apparatus. A voltage gradient can then be applied between electrodes of the probe cell that is equal to or somewhat greater than the film-promoting voltage gradient applied to working contacts in the LTC or related device. Film formation on the working contacts can then be modeled with a useful degree of accuracy.

The probe cell can be installed in the same environment as the contacts of interest. In some embodiments, the same environment will be realized by placing the probe cell as close as possible to the working contacts. In other embodiments, a replica environment, in which heaters, baffles, fill fluid circulators, or other components render the environments as similar as may be needed to achieve a desired level of similarity in response to stress, may be preferred.

Similarly, the oil bath for the working contacts and the probe cell may be the same fluid experiencing virtually the same stress as in a device lacking the probe cell, where the probe cell is collocated with the working contacts. In other embodiments, oil that has been in proximity to the working contacts may be pumped to bathe the probe cell. It may be advantageous, where a replica environment is used, to apply to the probe cell stresses that are closely matched to and, in some embodiments, slightly more severe than, the stresses to which the working equipment is subjected.

Since a tendency to form destructive films increases with voltage stress and contact temperature, having an applied voltage that is slightly greater than that applied to the working contacts and raising the electrode temperature above the working contact temperature may cause film formation on the probe cell to advance at a rate that slightly exceeds that on the working contacts of the monitored equipment. Where an adequate safety margin is designed into a working apparatus such as an LTC, including as needed an error term accounting for imprecision in the simulation, an indication of need for service can be developed in slightly overstressed simulation apparatus at a time consistent with but slightly earlier than that in the working apparatus. A request for service can thus be issued by a telemetered or periodically visited system in accordance with the inventive concept adequately in advance of a system failure.

Film buildup can be monitored with multiple instruments that measure electrical characteristics of the probe cell. A non-definitive list of electrical measurements of the probe cell that undergo changes that are in part associated with film buildup includes AC and DC impedance at low voltage, capacitance, dissipation factor, and resistivity. As the relatively lossy film accretes, the impedance, capacitance, dissipation factor, and resistivity of the probe tend to grow progressively worse—that is, interelectrode DC and AC voltage drop for a given current both decrease, capacitive coupling between the electrodes increases, AC loss due to the film supplanting the oil bath increases, and the calculated specific conductivity increases.

At a point in the operation of an LTC or other testable device, the rate of film accretion tends to increase appreciably. This point tends to be relatively consistent within function types, sizes, and construction styles for a specific stress load, but may be expected to vary somewhat due to sample variation and to vary greatly with stress load. It is at the accelerated accretion "knee" that prompt service becomes needful, that is, that the "ticking of the clock" of system degradation becomes noticeable. Prior practice maintenance inspection practices performed before the degradation reaches this threshold will in many cases show little breakdown, so that an incipient failure may not be anticipated. Lacking the probe cell, an inspection sophisticated enough to detect a looming failure of a device may not be performed consistently within a time window that allows a destructive failure to be prevented.

FIG. 1 shows a schematic drawing of an exemplary embodiment of a probe 10 wherein is situated, at the center of the probe 10, an inner electrode 12 made of one or more of the contact metals used in the contact assembly being simulated, formed in a practical shape such as an oblong block or slug. Of course, other shapes may be used as deemed appropriate. Surrounding the center electrode 12 in part is a porous outer electrode 14 that serves to establish a broadly uniform voltage field and further serves as a portion of the measuring circuit. The porosity of the outer electrode 14 may be achieved by methods such as forming holes through a solid shell, forming the electrode 14 from pulverized and sintered material, building a wire mesh structure, and other manufacturing methods that demonstrably provide the physical and electrochemical characteristics needed for the outer electrode 14. A typical probe cell structure may have a cylindrical inner electrode 12 with rounded edges to reduce gradient variations, surrounded by a stainless steel screen outer electrode 14 formed into a cylindrical sleeve and held in position by nonconductive, preferably low-loss, spacers 16, with the whole mounted to the switchgear enclosure 18 using a mounting arrangement such as, for example, brackets 20.

The exemplary embodiment in FIG. 1 shows the respective electrodes 12 and 14 as close-fitting cylinders. In other embodiments, the respective inner and outer electrodes 12 and 14 can take the form of substantially parallel plates of various boundary profiles, for example. In many embodiments, proximal surfaces of the electrodes 12 and 14 may preferably have continuous and conformal curvatures, whereby voltage gradients and thus film formation rates can be made relatively uniform. Thus, concentric cylinders or parallel, circular plates may provide more representative simulation of rates of degradation than structures having pronounced edges or corners in the electric field region. While actual switchgear structures may have sharp edges in critical locations, the simulation can provide a model that can be corrected computationally for actual switchgear's less uniformly accreting structures.

For convenience of connection, it may be preferred to join a conventional electrical terminal to each of the probe cell electrodes. As shown in FIG. 1, a first terminal 22 is part of the inner electrode 12, while a second terminal 24 is part of the outer electrode 14. The respective terminals in various exemplary embodiments allow attachment of ring tongue terminals using screws, press-on terminals using mating blades and receptacles, prepared wires using clamp devices, and the like, where the wires attached to the respective electrodes are connected to the measuring circuit.

FIG. 1 further shows a representative exemplary test configuration potentially useful for an apparatus according to the invention. The test configuration can include a raw power feed 26 from which power sources 28 provide alternating current (AC) and/or direct current (DC) as indicated for accurate simulation. Working switchgear normally uses AC power (typically 60 Hz or 50 Hz by country) on which comparatively small DC signals may be superimposed, backfed from loads or associated with earth ground artifacts. The overall test circuit of FIG. 1 establishes a high voltage gradient using low voltage by closely spacing the electrodes. One or more voltmeters 30, separately or in combination measuring AC and DC voltage, and positioned to measure voltage drop across the probe cell, are preferably selected for acceptable resolution with the expected signal levels. Current flow between electrodes through the low-conductivity oil in probe cell embodiments can be comparatively small, so that an ammeter 32 may in a typical embodiment include a shunt, a Hall effect device, or the like as an embedded or external component to permit measurement. Temperature measurement may be realized with one or more thermocouple or semiconductor probes 34 or other devices.

Apparatus 36 for measuring phenomena such as dissipation factor, capacitance, and resistivity may apply excitation test signals to the probe cell such as, for example, sine waves at frequencies on the order of 100 Hz to 1 MHz. Dissipation factor, as an example, is classically calculated as the tangent of the difference between voltage and current phase angles. Other frequencies, as well as DC, may be used according to design preference for individual tests.

Measured properties may change over extended time intervals from baseline attributes of individual probe cells. Data may in some embodiments be accumulated and compared over time. Comparisons between results acquired at different times may require compensation factors such as temperature scaling for accurate gauging of film accretion and other forms of switchgear degradation.

Operation of test apparatus as described above can be regulated using a control function 38, capable in some embodiments of setting test parameters, collecting test results, and passing test data to an interface device 40, where the interface device 40 communicates 42 to external data collection apparatus 44. Regulation by the control function 38 may include establishing nominal interelectrode AC and DC voltage levels according to a system model or other mission definition. Voltage regulation can use voltage and/or current feedback signals within the probe cell. Further control function 38 adjustments to respective power source 26 and 28 outputs can use switchgear operational parameters such as LTC tap setting (implying a composite of load current, outdoor temperature, and other parameters), LTC fluid temperature, fluid filter backpressure, and calculated terms such as probe cell 10 dissipation factor.

Temperature control of the probe cell 10 using a heater 46 powered from a heater control device 48 managed by the control function 38 can ensure that the probe cell 10 thermal load is substantially the same as the switchgear. One or more temperature sensors positioned in the switchgear apart from the probe cell 10 may ensure that the heater 46 operates at a desired temperature with respect to switchgear contacts. In some embodiments, probe cell 10 position may obviate need for a heater 46.

Data analysis, including storage and computation, can take place within the locally installed control function 38 or at external apparatus to which the test data is passed, as appropriate for an embodiment. Test results in some embodiments may be directly usable, while in other embodiments, accumulation and comparison of testing over time, as well as further analysis, may be required before action can be taken.

Representative LTC or other switchgear apparatus may have additional devices, such as oil filter assemblies, attached, wherein the devices use pumps that periodically circulate the fill fluid through filter media. Such devices preferentially circulate fill fluid with reasonable efficacy, in order to prevent trapping of contaminants in stagnant pockets outside the filter. In some probe cell 10 embodiments, such deliberate circulation of fill fluid can be sufficient to expose the probe cell 10 to the working environment; in other embodiments, such as in retrofit applications, changes in frequency or duration of operation of the filter pump or provision of additional fluid circulator devices may be required for simulation accuracy.

Figure 2:
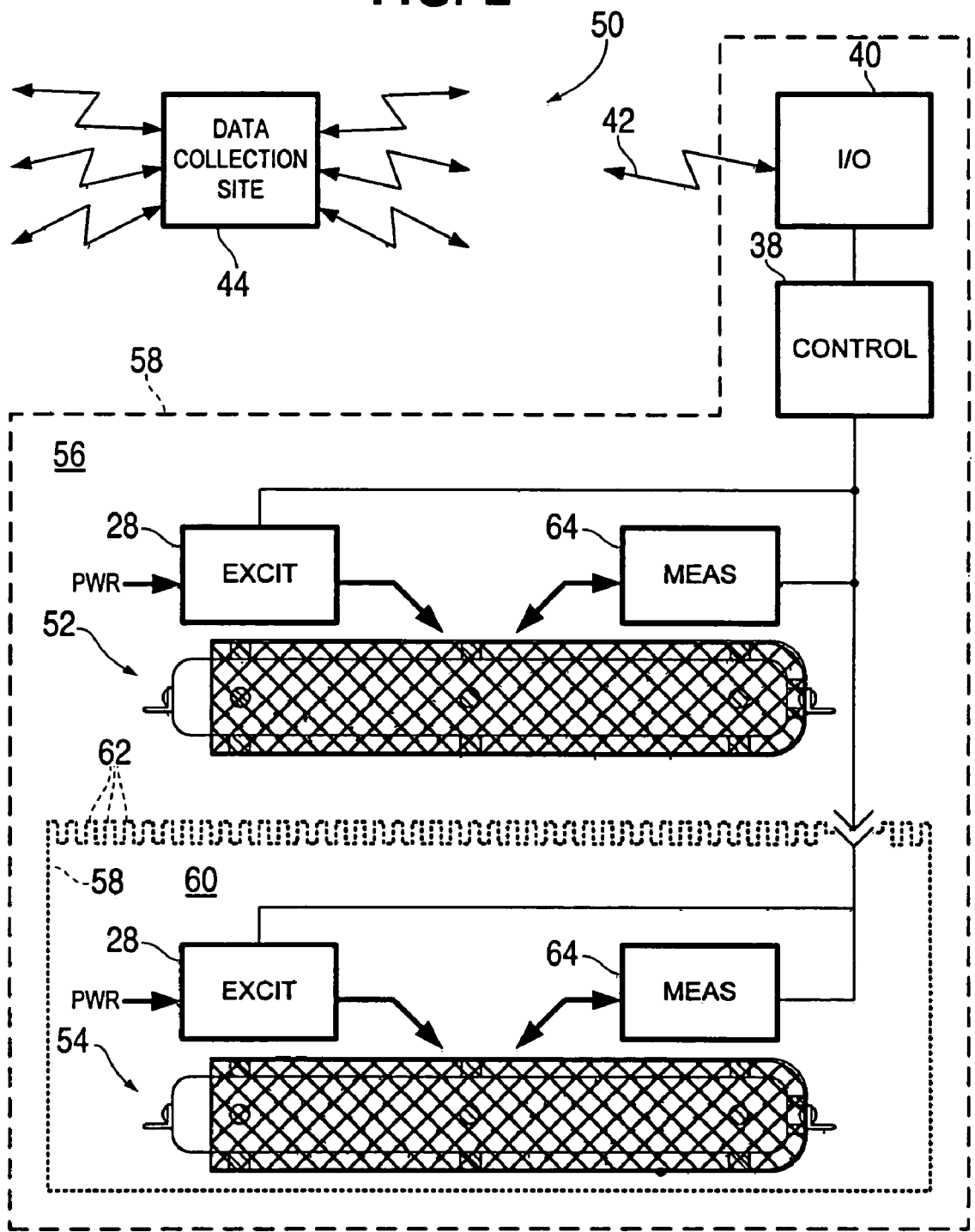
FIG. 2 is a schematic view illustrating a reference node for a monitoring system.

FIG. 2 shows an alternative embodiment 50 wherein a probe cell 52 and a reference cell 54 are provided. The probe cell 52, which may be comparable to that discussed above, uses oil 56 from the switchgear device 58, bathed over the probe cell 52, to allow film accretion to proceed at a rate comparable to that on working switchgear. The reference cell 54 is sealed inside a chamber 58 with a separate oil bath 60. Heat is transferred by fins 62 or another effective thermal coupling method, the use of a heater 46 as represented in FIG. 1, or the like, so that the voltage gradients and temperatures of the respective cells 52 and 54 are substantially equal, but the effects of switching arcs and other sources of fluid and electrode contamination are eliminated from the reference cell 54. This may allow voltage-dependent and temperature-dependent properties of the probe cell 52 to be measured directly, i.e., without requiring calculated compensation terms. Comparison between the respective cells 52 and 54 can remain valid over multiple-year intervals in some embodiments.

The output of the probe cell and reference cell measuring circuits 64 (based on the electrical characteristics of the probe cell of FIG. 1) can be used in some embodiments to provide, for a switchgear device 58 under evaluation, an overall "green-yellow-red" summary output to an operator. If thresholds strongly predictive of impending failure can be established, the "yellow" indication can be used to order repair parts on a routine basis, while the "red" indication can be used to schedule system downtime or arrange to bypass a unit, as appropriate for an application, then to take the unit offline for rework of the switchgear 58 without need to manage an emergency. Such a method can help to prevent performance of outdoor work under extreme weather conditions, for example, except in response to unforeseeable events such as lightning strikes, ice storms, and the like.

Figure 3:
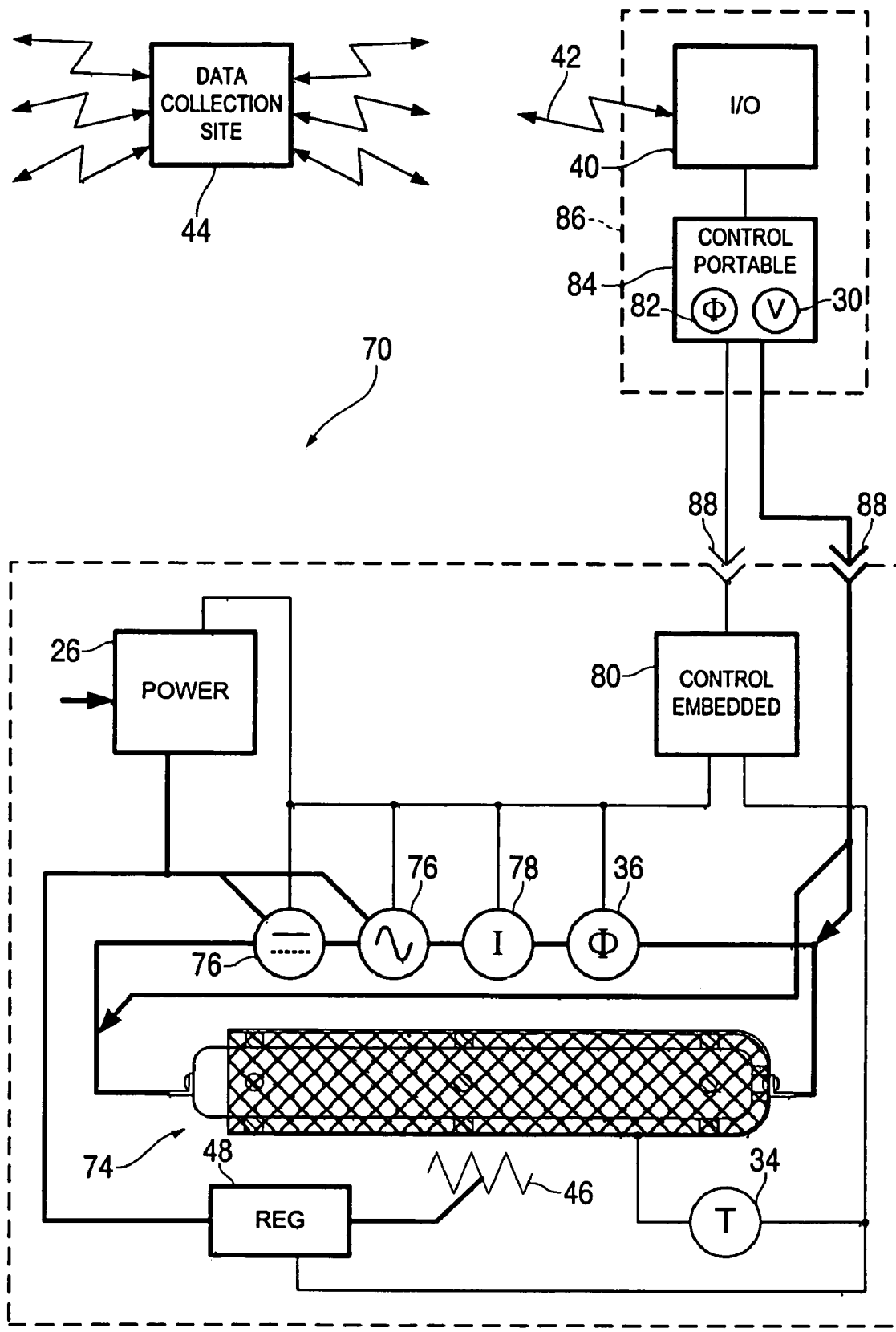
FIG. 3 is a schematic view illustrating a pluggable interface for a monitoring system.

FIG. 3 shows an alternative embodiment, wherein the test apparatus can be transportable in part, so that one or more embedded cells receive excitation as components of a periodic non-invasive test program. As shown in FIG. 3, a switchgear test apparatus 70 receives power internally 26, allowing electrical stress on the probe cell 74 to be applied continuously. Functions such as power sourcing 76 and in-line current monitoring 78 are shown as permanent components, along with sufficient control resources 80 to maintain function. Test elements that are not in continuous use, however, which may include components of phase detection apparatus 82 and data logging 84, are placed in a transportable assembly 86 that can be plugged into the switchgear using connectors 88. Where frequency with which testing is performed is sufficiently high, and where tested switchgear units are located closely enough together to make the alternative process economically feasible, such an embodiment may provide enough data samples to detect trends while reducing short-term or lifetime cost compared to inclusion of complete test sets and telemetry apparatus in each of many switchgear units. A design consideration in a switchgear maintenance program using transportable test gear may be provision of reliable, low-resistance connection ports in each tested unit, so that the tests evaluate the probe cells 74 and not the connectors 88. The dual-cell arrangement of FIG. 2 is likewise adaptable to use with the transportable test gear of FIG. 3.

It is to be understood that the apparatus and method for providing probe cells as described for use in load tap changers are also readily adaptable for use in other forms of electrical power transmission and switchgear equipment. In addition to load tap changers (LTCs), also referred to as on-load tap changers (OLTCs), such measurement systems may be applied to circuit switches, circuit breakers, deenergized tap changers, contact sets for series/parallel switches and phase shifting switches, and other devices.

It is to be further understood that the apparatus and method for providing probe cells as described for use in load tap changers are also readily adaptable for use in other forms of equipment, wherein neither large electrical potentials nor petroleum-derived insulating lubricants are necessarily involved. For example, mechanical devices such as diesel piston engines wherein heat and contamination of a working fluid may cause analogous coking effects on hot components virtually in the absence of electrical potentials may benefit from probe cell-based testing to schedule maintenance. Similarly, vacuum apparatus such as electrodeposition ovens may exhibit contamination phenomena requiring overhaul at intervals better managed through probe cell testing. Likewise, contamination buildup in hydroelectric facilities and water purification plants may be made more detectable and manageable using probe cells employing the principles described herein, adapted to the physical properties of the medium and the subject structures. Small systems may also benefit from probe cell use, including miniature and nanoscale systems such as medical implants, semipermeable membranes used in fuel cells and gas separators, and the like.

The many features and advantages of the invention are apparent from the detailed specification, and, thus, it is intended by the appended claims to cover all such features and advantages of the invention which fall within the true spirit and scope of the invention. Further, since numerous modifications and variations will readily occur to those skilled in the art, it is not desired to limit the invention to the exact construction and operation illustrated and described, and accordingly, all suitable modifications and equivalents may be resorted to that fall within the scope of the invention.

What is claimed is:

1. A probe cell for simulating electrical component degradation in switchgear, comprising:
   a probe core containing a first probe cell electrode having a conductive surface;
   a probe shell containing a second probe cell electrode, displaced from the probe core, wherein the probe shell further comprises:
      a porous electrode, permitting switchgear fill fluid transfer between a region surrounding the probe cell and a portion of a surface of the probe core sufficient to support simulation; and
      a shell terminal contact, connected electrically to a porous shell, wherein the shell terminal contact provides an electrical connection to the porous shell from a device external to the shell;
   a power source, wherein the power source establishes a probe interelectrode voltage field, wherein the probe interelectrode voltage field corresponds substantially to an operational condition of components subject to degradation; and
   a probe cell measurement group configured to detect at least one property of the probe cell.

2. The probe cell of claim 1, further comprising:
   a mounting provision, wherein constituent elements of the probe cell are assembled in a substantially fixed relationship therebetween, wherein the probe cell is positioned in a selected location within a switchgear housing, wherein the probe cell is affixable within the switchgear housing so as to be substantially immovable therewithin during switchgear operation.

3. The probe cell of claim 2, wherein the probe cell measurement group further comprises interface wiring to a disconnectable wiring interface, whereby a component of the probe cell measurement group is separable from the switchgear housing.

4. The probe cell of claim 1, further comprising:
   an immersion provision, wherein the constituent elements of the probe cell are configured for operation while immersed in a fill fluid suited for use in a switchgear housing.

5. The probe cell of claim 1, further comprising:
   a telemetry provision, wherein an element of information regarding a property of the probe cell, acquired by the probe cell measurement group, is transferred from the measurement group, wherein the transferred information element is in a form suitable for at least one of direct use and further processing.

6. The probe cell of claim 1, wherein the probe core further comprises:
   a conductive slug, configured in a shape, wherein surface characteristics of the slug correspond substantially to surface characteristics of a component in a switchgear apparatus; and
   a core terminal contact, connected electrically to the slug, wherein the core terminal contact provides an electrical connection to the slug from a device external to the slug.

7. The probe cell of claim 1, wherein the power source further comprises:
   a voltage supply, wherein electrical power from a source external to the probe cell is configured to provide probe interelectrode voltage over a range of probe interelectrode conductivities;
   a control circuit, wherein the control circuit determines the voltage provided by the voltage supply from a specified default voltage, wherein the instantaneous voltage is a function of a probe voltage supply input voltage, a probe interelectrode voltage, a probe temperature, an instantaneous probe circuit current, a switchgear contact current, a switchgear working hardware voltage, a switchgear contact temperature, a switchgear fill fluid conductivity, a switchgear fill fluid dissipation factor, a switchgear housing gas pressure, or a switchgear housing filter pressure drop; and
   an interconnect arrangement configured to provide electrical continuity between the probe core, the voltage supply, and the probe shell.

8. The probe cell of claim 1, wherein the probe cell measurement group further comprises at least one of:
   a voltage measurement apparatus, wherein a magnitude of probe interelectrode voltage is sensed;
   a current measurement apparatus, wherein a magnitude of probe interelectrode electrical current flow is sensed;
   a dissipation factor measurement apparatus, wherein a first phase relationship between voltage and current of an AC excitation signal is computed;
   a capacitance measurement apparatus, wherein a second phase relationship between voltage and current of an AC excitation signal is computed;
   a temperature measurement apparatus, wherein at least one temperature associated with the probe cell is sensed;
   a data collection apparatus, wherein a plurality of sensed probe cell measurements are acquired for a storage time interval; or
   a data transfer apparatus, wherein acquired probe cell measurements are telemetered from the probe cell measurement group.

9. The probe cell of claim 1, further comprising:
   a probe cell heater, wherein the heater is configured to accept electrical power supplied thereto, to convert the electricity into heat, and to apply the heat to the probe cell; and
   a probe cell heater regulator, wherein a level of electrical power applied to the heater is controlled to maintain the probe cell within a temperature range.

10. The probe cell of claim 1, further comprising:
   a reference assembly, substantially similar in geometry and materials to the probe cell, wherein the reference assembly is contained within a housing substantially filled with fill fluid equivalent to the switchgear fill fluid, wherein the housing is sealed sufficiently to substantially prevent interchange of fill fluid between the reference assembly and the switchgear, wherein the reference assembly is configured to accept electrical power supplied thereto, wherein an initial condition for a reference assembly interelectrode voltage field established thereby is substantially equal to an initial condition for the probe cell interelectrode voltage field;
   a reference assembly measurement group, whereby tests substantially equal to tests applied to the probe cell are applied to the reference assembly; and
   a switchgear probe comparator, wherein test results from the probe cell and test results from the reference assembly at successive times are compared.

11. The probe cell of claim 10, wherein the reference assembly measurement group further comprises interface wiring to a disconnectable wiring interface, whereby a component of the reference assembly measurement group is separable from the switchgear.

12. A probe cell for simulating electrical component degradation in switchgear, comprising:
  means for simulating a switchgear component with a simulation material;
  means for establishing a voltage gradient proximal to the means for simulating a switchgear component, wherein the voltage gradient corresponds substantially to an operational condition of a switchgear component subject to degradation;
  means for applying electrical power to the means for establishing a voltage gradient;
  means for measuring an electrical property of the means for simulating a switchgear component; and
  wherein the means for measuring an electrical property of the means for simulating a switchgear component further comprises at least one of:
  means for measuring voltage, wherein a magnitude of differential voltaae between the means for simulating a switchgear component and the means for establishing a voltage gradient is sensed;
  means for measuring electrical current, wherein a magnitude of electrical current flow between the means for simulating a switchgear component and the means for establishing a voltage gradient is sensed;
  means for measuring dissipation factor, wherein a first phase relationship between voltage and current of an alternating current (AC) excitation signal is computed;
  means for measuring capacitance, wherein a second phase relationship between voltage and current of an AC excitation signal is computed; or
  means for measuring temperature, wherein a temperature associated with the means for simulating a switchgear component is sensed.

13. The probe cell of claim 12, further comprising:
  means for mounting, wherein the means for simulating a switchgear component and the means for establishing a voltage gradient are assembled in a substantially fixed spatial relationship therebetween;
  means for positioning the means for simulating a switchgear component and the means for establishing a voltage gradient in a location within a switchgear housing, wherein the relative positions of the means for simulating a switchgear component and the means for establishing a voltage gradient are substantially fixed during switchgear operation; and
  means for immersing the means for simulating a switchgear component and the means for establishing a voltage gradient in a fill fluid suited for use in a switchgear housing.

14. The probe cell of claim 12, further comprising:
  means for collecting data, wherein measurements sensed by the means for measuring an electrical property are acquired for a storage time interval; and
  means for transferring data, wherein the measurements acquired by the means for collecting data are telemetered from the means for collecting data.

15. The probe cell of claim 12, further comprising means for measuring a reference component, wherein the means for measuring a reference component comprises:
  means for simulating a reference component;
  means for sealing the means for simulating a reference component from the means for simulating a switchgear component;
  means for establishing a reference voltage gradient proximal to the means for simulating a reference component, wherein the reference voltage gradient and the simulated switchgear component voltage gradient are substantially equal;
  means for applying electrical power to the means for establishing a reference voltage gradient;
  means for measuring an electrical property of the means for simulating a reference component; and
  means for comparing a result from the means for measuring an electrical property of the means for simulating a switchgear component to a result from the means for measuring an electrical property of the means for simulating a reference component.

16. A method for simulating electrical component degradation in switchgear, comprising:
  simulating a switchgear electrode with a first simulation material;
  establishing an interelectrode field with a second simulation material;
  spacing the first and second simulation materials to support establishment of an interelectrode field gradient therebetween;
  providing a source for application of electrical power to the interelectrode field, wherein the interelectrode field gradient established thereby corresponds substantially to an operational condition of components subject to degradation; and
  providing a degradation response measurement capability in the simulated switchgear, wherein providing a degradation response measurement capability further comprises at least one of:
  providing voltaae measurement capability, wherein a magnitude of differential voltage across the simulated interelectrode field is sensed;
  providing electrical current measurement capability, wherein a magnitude of electrical current flow through the simulated interelectrode field is sensed;
  providing dissipation factor measurement capability, wherein a first phase relationship between voltage and current of an AC excitation signal is computed;
  providing capacitance measurement capability, wherein a second phase relationship between voltage and current of an AC excitation signal is computed;
  providing temperature measurement capability, wherein a temperature associated with the simulated switchgear electrode is sensed;
  providing data collection capability, wherein measurements sensed by the degradation response measurement capability are acquired for a data storage time interval; or
  providing data transfer capability, wherein the sensed measurements are telemetered.

17. The method for simulating electrical component degradation in switchgear of claim 16, further comprising:
  mounting electrode components of a probe cell with a substantially known spacing therebetween;
  positioning the probe cell in a selected location within a switchgear housing; and
  fixing the probe cell within the switchgear housing so as to be substantially immovable therewithin during switchgear operation.

18. The method for simulating electrical component degradation in switchgear of claim 16, further comprising:

provoiding thermal factor management with respect to the simulation materials, wherein a temperature range of operation of the components being simulated and a temperature range of operation of the simulation materials are sufficiently known to permit substantial compensation for thermal factors in the simulation; and providing a chemical environment surrounding the simulation materials, wherein a chemical mixture in contact with a preponderance of the surface of the simulation materials is sufficiently related to a chemical mixture in contact with a preponderance of surface area of components being simulated to effectively model electrical component degradation therein.

19. A method for managing electrical component deterioration in switchgear, comprising:

simulating switchgear apparatus, wherein a probe cell, having at least two electrodes of substantially known spacing, provides simulation of dimensional, material, and electrical aspects of switchgear components;

promoting deterioration of probe cell electrodes by applying differential voltage therebetween, wherein the differential voltage corresponds substantially to an operational condition of switchgear components subject to deterioration;

providing test apparatus to measure probe cell electrical properties;

establishing probe cell fault values, wherein probe cell electrical properties correspond to deterioration-dependent switchgear failure risks; and reporting an extent of need for service of switchgear as a function of probe cell fault values.

20. The method for managing electrical component degradation in switchgear of claim 19, wherein simulating switchgear apparatus further comprises:

installing the probe cell within a switchgear apparatus housing; and sharing a fluid medium between the probe cell and switchgear apparatus within the switchgear housing.

21. The method for managing electrical component degradation in switchgear of claim 20, wherein simulating switchgear apparatus further comprises establishing an electrical voltage gradient between the electrodes of the probe cell, wherein an electrical loading so established corresponds substantially in magnitude and duration to operational electrical loading of switchgear components subject to deterioration.

22. The method for managing electrical component degradation in switchgear of claim 19, wherein providing test apparatus further comprises configuring recordation, wherein simulated switchgear apparatus deterioration test results are accumulated over time.

* * * * *